United States Patent
Schaefer et al.

(10) Patent No.: US 7,355,921 B2
(45) Date of Patent: Apr. 8, 2008

(54) DEVICE IN A MEMORY CIRCUIT FOR DEFINITION OF WAITING TIMES

(75) Inventors: Andre Schaefer, Munich (DE); Thomas Hein, Munich (DE); Christian Weis, Munich (DE)

(73) Assignee: Infineon Technologies AG, Munich (DE)

( * ) Notice: Subject to any disclaimer, the term of this patent is extended or adjusted under 35 U.S.C. 154(b) by 24 days.

(21) Appl. No.: 11/386,043

(22) Filed: Mar. 21, 2006

(65) Prior Publication Data

US 2006/0233005 A1    Oct. 19, 2006

(30) Foreign Application Priority Data

Mar. 22, 2005    (DE) ...................... 10 2005 013 237

(51) Int. Cl.
*G11C 8/00*    (2006.01)
(52) U.S. Cl. ................. 365/233; 365/236; 365/189.07; 365/189.05; 365/194
(58) Field of Classification Search ................ 365/233, 365/236, 189.07, 189.05, 194
See application file for complete search history.

(56) References Cited

U.S. PATENT DOCUMENTS

| | | | |
|---|---|---|---|
| 5,907,857 A | * | 5/1999 | Biswas ....................... 711/106 |
| 6,166,990 A | * | 12/2000 | Ooishi et al. ............... 365/233 |
| 6,684,278 B1 | | 1/2004 | Sakugawa et al. |
| 6,841,983 B2 | * | 1/2005 | Thomas ...................... 323/322 |

FOREIGN PATENT DOCUMENTS

DE    10025250 A1    1/2001

* cited by examiner

*Primary Examiner*—Tuan T. Nguyen
(74) *Attorney, Agent, or Firm*—Patterson & Sheridan, L.L.P.

(57) ABSTRACT

A device for definition of the waiting time which should pass in a clock-controlled memory circuit after the start of a specific operation until a subsequent operation may be started. The device includes a digital timer which is arranged in the memory circuit, is switched on when the specific operation is initiated and allows the subsequent operation to be started after a defined time period has elapsed. The digital timer, after it is switched on, counts periodic counting pulses which are derived from the clock signal, in order to signal the end of the waiting time as soon as it has counted a desired number of these pulses. A waiting time adjustment apparatus is provided and is accessible via external connections of the memory circuit in order to set the desired number of counting pulses.

20 Claims, 3 Drawing Sheets

FIG 3

DECODER 54 (FIG 2)

| INPUT | | | | | | | OUTPUT | | | | | | | | | | | |
|---|---|---|---|---|---|---|---|---|---|---|---|---|---|---|---|---|---|---|
| DECIM A6:A10 | A10 | A9 | A8 | A7 | A6 | → | B5 | B4 | B3 | B2 | B1 | B0 | DECIM B0:B5 | S0 | S1 | S2 | S3 | S4 |
| 0 | 0 | 0 | 0 | 0 | 0 | → | 0 | 0 | 0 | 0 | 0 | 0 | 0 | 1 | X | X | X | X |
| 1 | 0 | 0 | 0 | 0 | 1 | → | 0 | 0 | 0 | 0 | 1 | 1 | 3 | 0 | 0 | 0 | 0 | 0 |
| 2 | 0 | 0 | 0 | 1 | 0 | → | 0 | 0 | 0 | 1 | 0 | 1 | 5 | 0 | 0 | 0 | 0 | 0 |
| 3 | 0 | 0 | 0 | 1 | 1 | → | 0 | 0 | 0 | 1 | 1 | 1 | 7 | 0 | 0 | 0 | 0 | 0 |
| 4 | 0 | 0 | 1 | 0 | 0 | → | 0 | 0 | 1 | 0 | 0 | 1 | 9 | 0 | 0 | 0 | 0 | 0 |
| 5 | 0 | 0 | 1 | 0 | 1 | → | 0 | 0 | 1 | 0 | 1 | 1 | 11 | 0 | 0 | 0 | 0 | 0 |
| 6 | 0 | 0 | 1 | 1 | 0 | → | 0 | 0 | 1 | 1 | 0 | 1 | 13 | 0 | 0 | 0 | 0 | 0 |
| 7 | 0 | 0 | 1 | 1 | 1 | → | 0 | 0 | 1 | 1 | 1 | 1 | 15 | 0 | 0 | 0 | 0 | 0 |
| 8 | 0 | 1 | 0 | 0 | 0 | → | 0 | 1 | 0 | 0 | 0 | 1 | 17 | 0 | 0 | 0 | 0 | 0 |
| 9 | 0 | 1 | 0 | 0 | 1 | → | 0 | 1 | 0 | 0 | 1 | 1 | 19 | 0 | 0 | 0 | 0 | 0 |
| 10 | 0 | 1 | 0 | 1 | 0 | → | 0 | 1 | 0 | 1 | 0 | 1 | 21 | 0 | 0 | 0 | 0 | 0 |
| 11 | 0 | 1 | 0 | 1 | 1 | → | 0 | 1 | 0 | 1 | 1 | 1 | 23 | 0 | 0 | 0 | 0 | 0 |
| 12 | 0 | 1 | 1 | 0 | 0 | → | 0 | 1 | 1 | 0 | 0 | 1 | 25 | 0 | 0 | 0 | 0 | 0 |
| 13 | 0 | 1 | 1 | 0 | 1 | → | 0 | 1 | 1 | 0 | 1 | 1 | 27 | 0 | 0 | 0 | 0 | 0 |
| 14 | 0 | 1 | 1 | 1 | 0 | → | 0 | 1 | 1 | 1 | 0 | 1 | 29 | 0 | 0 | 0 | 0 | 0 |
| 15 | 0 | 1 | 1 | 1 | 1 | → | 0 | 1 | 1 | 1 | 1 | 1 | 31 | 0 | 0 | 0 | 0 | 0 |
| 16 | 1 | 0 | 0 | 0 | 0 | → | 1 | 0 | 0 | 0 | 0 | 1 | 33 | 0 | 0 | 0 | 0 | 0 |
| 17 | 1 | 0 | 0 | 0 | 1 | → | 1 | 0 | 0 | 0 | 1 | 1 | 35 | 0 | 0 | 0 | 0 | 0 |
| 18 | 1 | 0 | 0 | 1 | 0 | → | 1 | 0 | 0 | 1 | 0 | 1 | 37 | 0 | 0 | 0 | 0 | 0 |
| 19 | 1 | 0 | 0 | 1 | 1 | → | 1 | 0 | 0 | 1 | 1 | 1 | 39 | 0 | 0 | 0 | 0 | 0 |
| 20 | 1 | 0 | 1 | 0 | 0 | → | 1 | 0 | 1 | 0 | 0 | 1 | 41 | 0 | 0 | 0 | 0 | 0 |
| 21 | 1 | 0 | 1 | 0 | 1 | → | 1 | 0 | 1 | 0 | 1 | 1 | 43 | 0 | 0 | 0 | 0 | 0 |
| 22 | 1 | 0 | 1 | 1 | 0 | → | 1 | 0 | 1 | 1 | 0 | 1 | 45 | 0 | 0 | 0 | 0 | 0 |
| 23 | 1 | 0 | 1 | 1 | 1 | → | 1 | 0 | 1 | 1 | 1 | 1 | 47 | 0 | 0 | 0 | 0 | 0 |
| 24 | 1 | 1 | 0 | 0 | 0 | → | 0 | 0 | 0 | 0 | 0 | 0 | 0 | 1 | X | X | X | X |
| 25 | 1 | 1 | 0 | 0 | 1 | → | 0 | 0 | 0 | 0 | 0 | 0 | 0 | 1 | X | X | X | X |
| 26 | 1 | 1 | 0 | 1 | 0 | → | 0 | 0 | 0 | 0 | 0 | 0 | 0 | 1 | X | X | X | X |
| 27 | 1 | 1 | 0 | 1 | 1 | → | 0 | 0 | 0 | 0 | 0 | 0 | 0 | 1 | X | X | X | X |
| 28 | 1 | 1 | 1 | 0 | 0 | → | 0 | 0 | 0 | 0 | 0 | 0 | 0 | 1 | X | X | X | X |
| 29 | 1 | 1 | 1 | 0 | 1 | → | 0 | 0 | 0 | 0 | 0 | 0 | 0 | 1 | X | X | X | X |
| 30 | 1 | 1 | 1 | 1 | 0 | → | 0 | 0 | 0 | 0 | 0 | 0 | 0 | 1 | X | X | X | X |
| 31 | 1 | 1 | 1 | 1 | 1 | → | 0 | 0 | 0 | 0 | 0 | 0 | 0 | 1 | X | X | X | X |

DEVICE IN A MEMORY CIRCUIT FOR DEFINITION OF WAITING TIMES

CROSS-REFERENCE TO RELATED APPLICATIONS

This application claims foreign priority benefits under 35 U.S.C. §119 to co-pending German patent application number DE 10 2005 013 237.5, filed 22 Mar. 2005. This related patent application is herein incorporated by reference in its entirety.

BACKGROUND OF THE INVENTION

1. Field of the Invention

The invention relates in general to data memory circuits, and relates in particular to a device for definition of the waiting time to be complied with after a storage operation.

2. Description of the Related Art

Digital data memory circuits contain a large number of addressable memory cells, an instruction decoding device for decoding external instructions, and a control device for controlling or initiating operations for operation of the memory circuit, in each case as a function of the decoded instructions. The operation of a data memory circuit includes, in particular, the writing and reading of data to and from selectively addressed memory cells. In principle, a write access or read access comprises a data link being set up between the respectively addressed memory cells and the data connections of the memory circuit, which normally comprises the closing of selected electronic switches in a network of control and data lines which covers the entire array of memory cells. Each write or read process comprises a sequence of individual operations and, in the case of most conventional memory circuits, the relevant operation instructions are applied by an external controller. In general, the controller "knows" the specification of the memory circuit and is thus from the start approximately "aware" of how long it will take to carry out an operation instruction and how long it must in consequence wait until it may send a new instruction which ends the already instructed operation.

However, it is possible for the controller not to be matched exactly to the specification of the memory circuit, and to send a new instruction too early. In this case, the new instruction must not be followed, at least not when the previous operation is "critical" in the sense that its early termination would lead to errors in the subsequent operation, or even to permanent errors in the memory content. Furthermore, in some memory circuits, there are certain operating procedures which are initiated by the controller by an instruction, and then take place as an internally controlled sequence of operations. In this case as well, it is necessary to wait for successful completion of an operation before the next operation is initiated internally.

If the successful completion of an operation cannot be detected and signaled (or if such detection and signaling would be too complex or time-consuming), it is expedient to use a timer which is triggered by the initiation of a "critical" operation and allows a subsequent operation to be started or initiated after a defined time interval. This is conventional in DRAM modules, to be precise particularly for definition of the waiting time "$t_{RAS}$" between the start of an operation of access to addressed cells and a subsequent reset operation, as explained in the following text.

In the case of conventional DRAM modules, the memory cells within individual fields or segments are each arranged in rows and columns in the form of a matrix. Each cell has an associated control line, which is referred to as a "word line", and each column has an associated sense line, which is referred to as a "bit line", which normally has two cores and leads to an amplifier which is associated with the relevant column. These amplifiers are referred to as "read amplifiers" or "sense amplifiers", although they amplify not only data to be read but also data to be written. Access to a cell is started by activation of the relevant word line on the basis of a row address, as a result of which, the switches at all of the cells in the associated row are closed (that is to say they are switched on) in order to connect these cells via the bit lines to the read amplifiers. In detail, the charge in the cells is dissipated onto the bit lines during this process, which until then have been applied to a common "precharge potential". The discharging of the cell charge results in the potential on one of the bit line cores rising or falling in each case with respect to the other bit line core, which remains at the precharge potential. The read amplifiers detect the respective potential differences on the bit line pairs and amplify these differences, so that the bit line core with the lower potential is changed to the "low" (earth) potential "L", and the bit line core with the higher potential is changed to the "high" supply potential "H" of the memory cell array. This results in the information sensed at the cells being written back to the cells in an amplified form, and thus being refreshed.

During an actual read or write operation, following the activation process described above, the read amplifiers are selectively connected, under the control of column address information, to the data connections of the DRAM module. During reading, the data which is "latched" (that is to say held) in the read amplifiers is tapped off at the data connections; for writing, the data which is held in the read amplifiers is overwritten with the new data entered at the data connections, and is thus transmitted via the bit lines to the memory cells.

The entire process of word line activation and amplification by the read amplifier takes a certain minimum amount of time, which is described by the specification parameter $t_{RAS}$. If a wait for this time is not introduced, for example as a result of a subsequent "precharge" operation being started too early (that is to say the precharging of the bit lines), data losses can occur. In order to preclude this risk, a $t_{RAS}$ timer is activated on word line activation, which does not allow the precharge to be carried out, or does not initiate it, until the full charge state of the cells has been produced.

In the case of the conventional devices, the $t_{RAS}$ timer which is arranged in the DRAM module is an analogue timer, whose delay time is governed by the time constant of an RC circuit. Fluctuations in process parameters during the production of the module and fluctuations in parameters such as the temperature and voltage during operation of the module can lead to fluctuations both in the actual $t_{RAS}$ time in the memory cell array and in the actual delay time of the $t_{RAS}$ timer. For this reason, this timer has in the past been designed with a lead time which takes account of the worst case, that is to say it guarantees that its delay time at the lower end of its possible fluctuation range is still greater than the longest possible actual $t_{RAS}$ time.

This technique has the disadvantage that the $t_{RAS}$ timer is virtually never optimally matched to the instantaneous conditions. Because of the lead time that has been mentioned, the delay time of the timer is in most actual situations considerably longer than the actual $t_{RAS}$ time, so that the precharge operation is delayed further than would actually be necessary. This is at the expense of the operating speed of the DRAM module.

The activation process as described above in a DRAM module is just an illustrative example of processes or operations which are intended to take place in a data memory and must not be terminated or interfered with at any time by the initiation of a subsequent operation. The types of operation in question here depend on the respective type of data memory circuit, as do the waiting times which must be complied with between which operations. If timers similar to the $t_{RAS}$ timer as described above are used in order to comply with the respective waiting times, this results in the same disadvantages as above.

SUMMARY OF THE INVENTION

In accordance with a first aspect of the present invention, a device for definition of the waiting time which should pass in a clock-controlled memory circuit after the start of a specific operation until a subsequent operation may be started, includes a digital timer which is switched on when the specific operation is initiated and allows the subsequent operation to be started after a defined time period has elapsed. The digital timer, after it is switched on, counts periodic counting pulses which are derived from the clock signal CLK in order to signal the end of the waiting time as soon as it has counted a desired number of these pulses, Further a waiting time adjustment apparatus is provided and is accessible via external connections in order to set the desired number of counting pulses.

In accordance with a second aspect of the present invention, a memory circuit includes a timer which is switched on when the specific operation is initiated and allows the subsequent operation to be started after a defined time period has elapsed. The timer includes is a digital counter which, after it is switched on, counts periodic counting pulses which are derived from a clock signal, and a comparator which signals the end of the waiting time as soon as the digital counter has counted a desired number of these pulses. The memory circuit further includes a mode register, which is accessible via external connections, with a plurality of register cells for storage of adjustment information, wherein a set of m cells of the mode register is selected for storage of an m-bit word, which contains the waiting time setting information for setting the desired number of counting pulses.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 shows an exemplary code table for the information for setting the waiting time for the embodiment shown in FIG. 2.

DETAILED DESCRIPTION OF THE PREFERRED EMBODIMENT

Embodiments of the invention provides a device for definition of the waiting time to be complied with after a storage operation such that this waiting time can easily be matched to the instantaneous conditions. In a particular embodiment, the device is included in a digital RAM module (a memory which can be written to and read from with a random direct access capability to addressed memory cells), and in particular in a dynamic RAM (DRAM) or synchronous dynamic RAM (SDRAM), as are used as main memories or graphics memories in computers.

According to one embodiment of the invention, a device for definition of the waiting time which is intended to pass in a clock-controlled memory circuit after the starting of a specific operation before a subsequent operation may be started is provided. The memory circuit contains a timer which is switched-on at an initiation of the specific operation and which allows the subsequent operation to be started after a defined time period has elapsed. One embodiment of the invention is characterized in that the timer is a digital counter which, after it is switched-on, counts periodic counting pulses which are derived from the clock signal in order to signal the end of the waiting time as soon as it has counted a desired number of these pulses, and is also characterized in that a waiting-time adjustment apparatus is provided in the memory circuit and is accessible via external connections of the memory circuit in order to set the desired number of counting pulses.

Embodiments of the invention make use of the fact that the clock signal in the memory circuit provides a time standard which is independent of fluctuations in the process, temperature and voltage. The use of this time standard for operation of a pulse counter changes this counter to a timer whose delay time is firstly independent of the fluctuations mentioned and secondly can easily be set to the respectively desired value. The waiting time as defined by the timer can thus be optimally matched to the instantaneous conditions, simply by appropriate setting of the number of pulses counted at which the counter is intended to signal the end of the waiting time. In this case, of course, the clock signal frequency that is chosen for the storage operation must be taken into account, and this is always accurately known. The optimum setting of a waiting time by means of the device according to embodiments of the invention can be found empirically by means of tests. These tests can be carried out before use, and/or regularly in pauses during use of the memory circuit.

Figure 1:
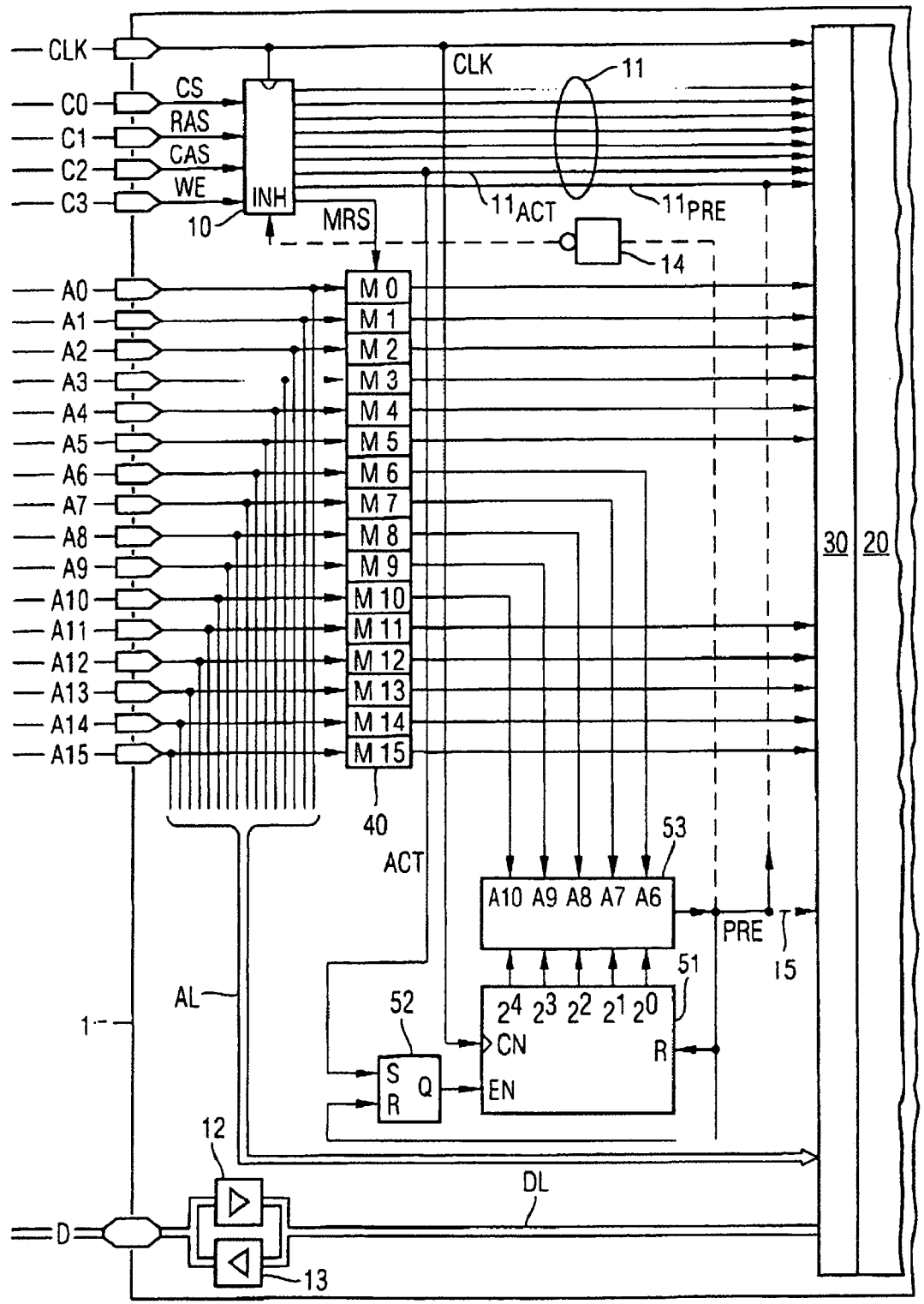
FIG. 1 shows a partial illustration of the design of a DRAM module with a device for definition of the $t_{RAS}$ waiting time according to a first embodiment of the invention.
Figure 2:
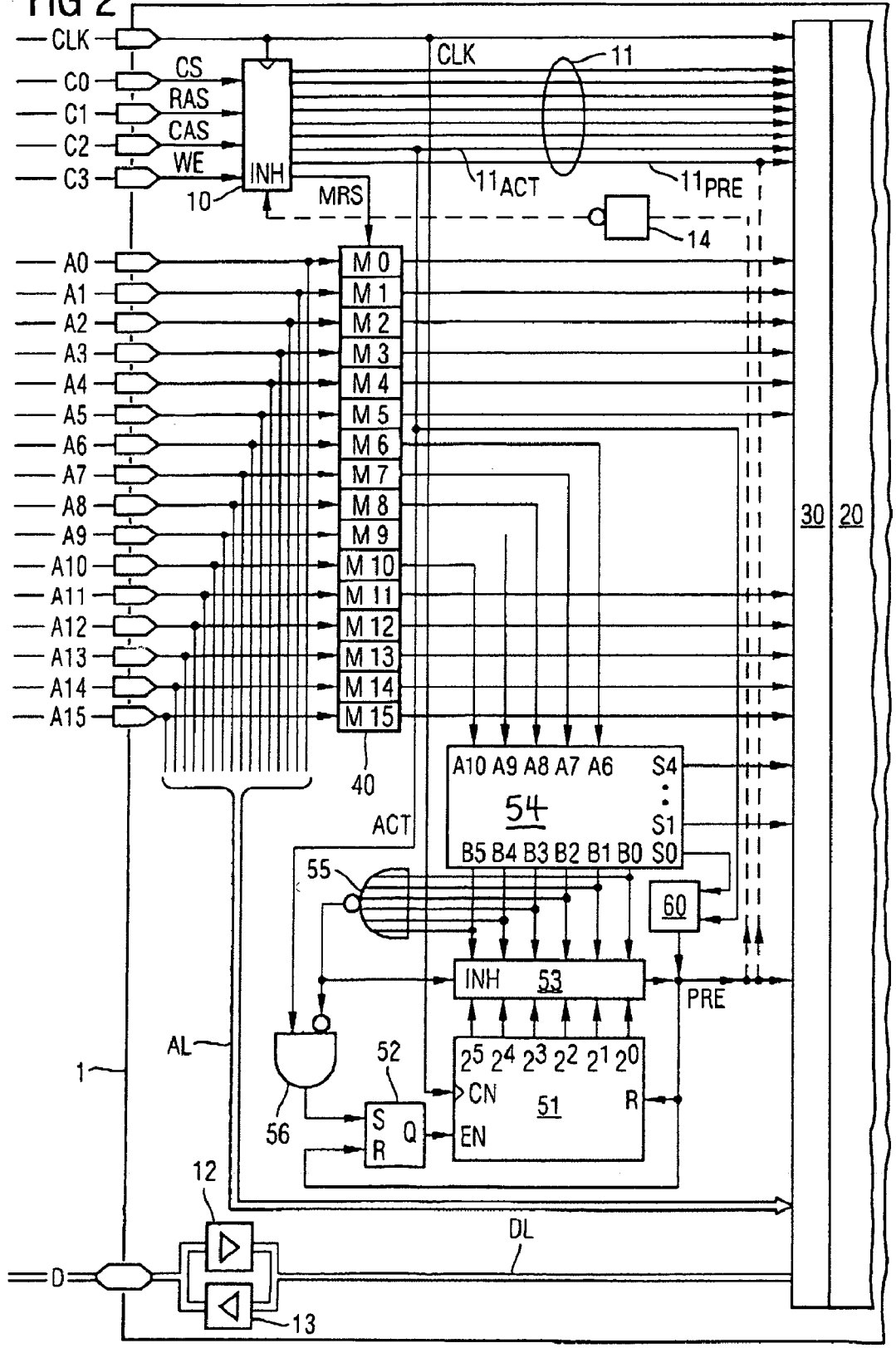
FIG. 2 shows a DRAM module with a device for definition of the $t_{RAS}$ waiting time according to a second embodiment of the invention.

In FIGS. 1 and 2, identical or similar elements are each annotated with the same capital letters, with a suffix number in each case being used for more detailed identification. In the following description, a colon ":" between two such numbers represents the word "to". Thus, for example "A1: 15" should be read as "A1 to A15".

FIG. 1 illustrates elements of a DRAM module 1 which is integrated on a chip. A large number of data memory cells are represented as a block 20. A control device, which is connected to the cell block 20, for selective write and read access to the memory cells is represented by the block 30.

The DRAM module 1 has a plurality of external connections, which are also referred to as "pins" and are connected during operation via connecting lines to corresponding connections of a controller (not shown). The figure shows: a "clock pin" for the system or basic clock signal CLK; four "instruction pins" for four parallel instruction bits C0:3, sixteen "address pins" for sixteen parallel address bits A0:15, and a group of "data transmission pins" for a plurality of parallel data bit streams and an accompanying data strobe signal, in this case annotated "D" overall.

The instruction bits C0:3 sent by the controller form a 4-bit parallel code word and are decoded in the DRAM module 1 by means of an instruction decoder 10, in order to activate in each case one of a plurality of instruction lines 11, as a function of the bit pattern of the code word. The four instruction bits C0:3 are conventionally referred to as CS, RAS, CAS, WE. In each clock period of the clock signal CLK, the controller sends some selected instruction code word, which is either an operation instruction providing instructions for some operation of the DRAM module, or a so-called "NOP" instruction (no operation), which means "no operation". The operation instructions also include the activation instruction ACT, which has already been mentioned above and causes the activation signal for connection of the addressed memory cells to associated read amplifiers, and also an instruction "set mode register", or MRS for short, for activation of a process for setting operating parameters of the DRAM module.

In order to input and output the bit data streams and the strobe signal to and from the DRAM module 1, each data transmission pin is connected to the input of an associated reception driver 12 and to the output of an associated output driver 13 (for reasons of clarity, the overall parallel arrangement of the D pins that have been mentioned, of the driver pairs and of the associated lines is illustrated in bus form). All of the drivers 12, 13 have control connections (not shown) in order to respectively activate the reception drivers 12 in response to a write instruction decoded by the instruction decoder 10, so that they pass the received data bit streams and the strobe signal to the associated internal data/strobe lines DL. The output drivers 13 are respectively activated in response to a read instruction in order to send the data streams, which have been read in the RAM module via the data lines DL, and the accompanying strobe signal to the controller.

The data memory cells to which the write data should be written or from which the read data should be read are selected in a known manner via the control device 30 in response to the address bits A0:15, which are applied at a suitable time by the controller, at the same time as the application of the activation instruction ACT. A specific subset of the address bit pins is used for bank addressing, and the other address pins are used for row and column addressing. The row and column address bits are passed via an address bus AL to the control device 30, where they are decoded in row and column address decoders.

During operating times in which no data is being transmitted between the DRAM and the controller, the address pins and/or the data transmission pins can be used for inputting control information for adjustment of various operating parameters of the DRAM module 1. In the case of the example described here, the address pins are used for this purpose. The control information which is input via the address pins, and is also referred to as "mode information" is normally transmitted to a so-called mode register, where it is stored. For this purpose, each of the sixteen address pins is connected to the data input of a respectively associated example of sixteen cells M0:15 in a mode register 40, whose trigger or set connection is connected to that instruction line of the instruction decoder 10 which is activated on reception of the "set mode register" instruction (MRS instruction). The 16-cell mode register 11 thus receives the mode information, which comprises 16 bits and is applied to the address pins at the time of the MRS instruction. The 16 outputs of the 16 mode register cells M0:16 thus produce an image of this information.

The features of the DRAM module 1 described so far are generally known. The following text describes how embodiments of the present invention can be implemented in a memory module such as this, particularly using the example of the definition of the $t_{RAS}$ waiting time which must be complied with between the initiation of a cell access and a subsequent precharge.

As explained above, the operation of access to addressed memory cells is initiated by the activation instruction ACT, which activates the word line of the addressed cells via the control device 30. This instruction ACT starts a timer which, according to embodiments of the invention, is formed by a digital pulse counter 51. In the illustrated case, the pulse counter is a binary counter which counts upwards and represents the counts by means of an n-bit word corresponding to an n-digit binary number.

In the embodiment shown in FIG. 1, n=5, that is to say each count is represented as a 5-digit binary number by means of a 5-bit word at five output connections $2_0 \ldots 2_4$ of the counter 51. On initialization of the DRAM module 1, the counter 51 is set to the count of zero via its reset input R. An edge-triggered set/reset flipflop (RS flipflop) 52 is used to switch the counter 51 on and off, and its Q output is connected to the switch-on connection EN of the counter 51. The set input S of the flipflop is connected to that output line $11_{ACT}$ of the instruction decoder 10 whose start of effectiveness ("high" potential or logic value "1" on this line) signals the activation instruction ACT. The counter 51 is thus switched on when the activation instruction appears and, after this time, counts the pulses of the clock signal CLK which is applied to its counting input CN.

The count which appears at the counting outputs $2_0 \ldots 2_4$ of the counter 51 is supplied to one side of a comparator 53, to whose other side a preselected numerical value is applied. This numerical value is selected such that it indicates the number of clock periods which corresponds to the desired $t_{RAS}$ time. As soon as the count of the counter reaches this numerical value, the comparator 53 switches a signal PRE to the effective level ("high logical potential "1"). The relevant signal flank resets the counter 51 to zero again via its connection R, and also resets the flipflop 52, in order to switch the counter 51 off again. The effective level of the signal PRE initiates or enables the initiation of the precharge via the control device 30. This depends on the actual instruction structure of the DRAM module 1, with regard to the handling of the PRE for this purpose:

In the case of an instruction structure with "externally instructed precharge", the controller sends a precharge instruction which normally switches a precharge instruction line 11 PRE to the active level via the instruction decoder 10, thus initiating the precharge. However, if this instruction appears before the $t_{RAS}$ waiting time has elapsed, it must be ignored as an "illegal" instruction, or its execution must be delayed until the time $t_{RAS}$ has passed. A specific inhibit circuit (not shown) can be provided for this purpose in the instruction decoder 10, which prevents the activation of the instruction line 11 PRE until the signal PRE is ineffective at the output of the comparator 53. This option is indicated by dashed lines in FIG. 1, by means of a connection from the comparator output via an inverter 14 to an inhibit input INH of the instruction decoder 10.

In the case of an instruction structure with "automatic precharge", there is no precharge instruction from the controller, and, instead, the precharge is always carried out automatically once the $t_{RAS}$ time has elapsed. In this option, the output signal PRE from the comparator 53 is applied directly to the control device 30, either via a separate connecting line 15 (as shown by dashed lines in FIG. 1) or by connection of the comparator output to the precharge instruction line 11 PRE (if present).

The desired numerical value for the $t_{RAS}$ time is set at the comparator 53 via the mode register 40. For this purpose in the illustrated case, m=5 cells and M6:10 in the register are used for this purpose, in order to record five bits A6:10 via the relevant address connections of the DRAM module 1. The other eleven register cells M0:5 and M11:15 and the associated address connections of the DRAM module 1 can be used for any other desired mode settings.

In the embodiment shown in FIG. 1, the five bits A6:10, as a binary number, directly represent the desired numerical value for the $t_{RAS}$ time, and are applied directly to the comparator 53 to be compare with the five-digit count of the counter 51. This is the simplest embodiment of the invention and allows fine (32-level) subdivision of the $t_{RAS}$ setting in individual steps of one clock period in each case. However, in this case, all of the register cells which are used for $t_{RAS}$ setting must be reserved exclusively for this adjustment process.

FIG. 2 shows the DRAM module 1 with another embodiment of the invention, in which the register cells and address connections which are used for $t_{RAS}$ setting can alternatively be used for other mode settings. All of the elements in FIG. 2 which are annotated with the same reference symbols as in FIG. 1 operate in the same way as has been described with reference to FIG. 1. Only the differences from the embodiment shown in FIG. 1 will be described in the following text.

The embodiment shown in FIG. 2 is based on the idea that the adjustment range for $t_{RAS}$ does not need to extend at the lower end as far as the value zero but only as far as a finite minimum value, and that the graduation of the adjustment need not be as fine as the graduation of the numerical values of the counter. It may thus be sufficient when the counter has a counting range from 0 to $2^n$, to use a value scale which is coarser than a $2^n$ subdivision for setting the $t_{RAS}$ time at the comparator. For example, a value scale may include only every alternate (or every third, etc) count of the counter. As will be described in the following text, this opens up an alternative way to use the cells of the mode register 40.

According to FIG. 2, an adjustment decoder 54 is used to set the $t_{RAS}$ time at the comparator 53 and decodes the five bits A6:10 from the mode register 40 in accordance with the code table illustrated in FIG. 3. A specific subset of the total of $2^m=32$ possible patterns of the bits A6:10 is chosen for the purpose of selecting a correspondingly large set of different $t_{RAS}$ numerical values at the comparator 53. In the illustrated example, as shown in FIG. 3, 23 patterns of the bits A6:10 are chosen for this purpose, specifically those which correspond to the decimal numbers 1 to 23 (binary 00001 to 10111) from the total set of decimal numbers 0 to 31 (binary 00000 to 11111). The decoder 65 is designed such that it transforms or "maps" these 23 different patterns into 23 different output patterns at the output connections B0:5, which correspond to 23 different numerical values which subdivide a numerical range, which extends from a minimum number $Z_{min}$ to a maximum number $Z_{max}$, into 23 steps. $Z_{min}$ is the lowest numerical value for $t_{RAS}$, and $Z_{max}$ is the highest numerical value for $t_{RAS}$. In the illustrated example, $Z_{min}=3$ and $Z_{max}=47$, the graduation (pitch) of the 23 numerical values is uniform (linear mapping function) and is 2, so that numerical values of 3, 5, . . . 47 can be produced for the $t_{RAS}$ setting. This is just one example; the pitch can also be selected differently, and the mapping function may also be non-linear.

The $t_{RAS}$ numerical values are applied to the comparator from the decoder 54 as binary number bits, and n=INT[Id $(Z_{max})$)] bits are required for the binary number representation, that is to say the integer component of the logarithm to base 2 of $Z_{max}$. For the illustrated example of $Z_{max}=47$, n is therefore equal to 6. These six bits are produced at the six outputs B0:5 of the decoder 54 and are applied to the comparator 53 which, on the other side, receives the binary number representation of the number of pulses counted by the counter 51, to be precise from the n=6 bit outputs $2^0:2^5$ of this counter. As soon as this count matches the $t_{RAS}$ numerical value that is represented by the bits B0:5, the output PRE of the comparator 53 changes to the effective level. All of the following processes (resetting and switching off the counter 51 and the further use of the signal PRE) are carried out in the same way as that described above in conjunction with FIG. 1.

As mentioned, in the case of the embodiment shown in FIG. 2, only a subset of the 2 m=32 possible patterns of the bits A6:10 which are entered in the mode register 40 are used for setting the $t_{RAS}$ time. These patterns are referred to in the following text as the "time value bit pattern"; in the illustrated case, as shown in the table in FIG. 3, there are 23 bit patterns 00001 (decimal 1) to 10111 (decimal 23). There are nine remaining bit patterns 0000 (decimal 0) and 11000 to 11111 (decimal 24 to decimal 31), which are referred to in the following text as "reserve bit patterns", and can be used for other, alternative mode settings.

In order to set the alternative operating modes, the decoder 54 is provided with additional outputs S0:4. The decoder is designed such that it keeps all of these additional outputs at the logic value 0 unless it receives one of the reserve bit patterns from the mode register 40. However, if the decoder 54 receives any of the reserve bit patterns, it blocks the operation of the digital counting and comparison circuit 51, 53 and produces setting information at the additional outputs S0:4 for other alternative operating modes of the DRAM module 1.

In the illustrated example, the decoder 54 sets the six outputs B0:5 for the $t_{RAS}$ numerical value to 000000, as is shown in the table in FIG. 3 when it receives any of the reserve bit patterns from the mode register 40. This information can be used in order to keep the counting and comparison circuit 51, 53 ineffective, for example by means of a NOR gate 55, which receives the bits B0:B5. The output of this gate can be connected to an inhibit input INH of the comparator 53, in order to keep the comparator ineffective when all of the bits B0:5 are equal to zero. Furthermore, the inverted output of the gate 55 can be connected to an input of an AND gate 56, which is connected upstream of the set input S of the flipflop 52, in order to prevent the setting of this flipflop and thus to prevent the counter 51 from being switched on when all of the bits B0:5 are equal to 0.

The nine reserve bit patterns of the bits A6:10 and the additional decoder outputs S0:4 can then be used for different alternative mode settings. As is shown in FIG. 3, the decoder 54 can be designed such that it activates the output S0 on reception of each reserve bit pattern, in order to select a different device for definition of the $t_{RAS}$ time instead of the binary counter 51, for example a conventional RC timer 60, which is started by the instruction ACT and renders the signal PRE effective at the end of its delay time, as is shown in FIG. 2. The other outputs S1:4 can then supply additional setting information, in the form of a 4-bit word XXXX, from nine possible information items to the control device 30, depending on which of the nine possible reserve bit patterns is entered in the cells M6:10 of the mode register 40.

Embodiments of the invention have been described above in conjunction with the setting of the $t_{RAS}$ time, as an example of one advantageous application. However, the invention is not restricted to this application, but can also be used for setting other waiting times. In the same way, the designs chosen for the described embodiment should be regarded only as examples and may be varied depending on the requirements. By way of example, the desired fineness of the adjustment process and the maximum size of the adjustment range of the numerical values for the waiting time determine the magnitude of the number m of bits or mode register cells required for this adjustment process, and the magnitude of the proportion of the time value bit patterns that are used for the adjustment process (in comparison to the number of reserve bit patterns).

The numerical values for waiting time adjustment in turn depend on how high the repetition frequency of the counting pulses is. These pulses may be derived from the rising or falling edges of the clock signal CLK, so that their repetition frequency corresponds to the clock frequency. The pulses may also be derived from the rising and falling edges of the clock signal CLK, so that their repetition frequency is equal to twice the clock frequency. If desired, a frequency multiplier or a frequency divider (not shown) can also be used.

In one alternative embodiment of the invention, the pulse counter, which is used as a timer can be designed and connected such that it is set to the selected numerical value of the waiting time at or before the start, and then counts downwards on reception of the counting pulses in order to signal the end of the waiting time on reaching the count of zero.

While the foregoing is directed to embodiments of the present invention, other and further embodiments of the invention may be devised without departing from the basic scope thereof, and the scope thereof is determined by the claims that follow.

What is claimed is:

1. A device for defining a waiting time which should elapse in a clock-controlled memory circuit after a start of a specific operation until a subsequent operation may be started, comprising:
    a digital timer which is switched-on when the specific operation is initiated and allows the subsequent operation to be started after a defined time period has elapsed, wherein the digital timer, after it is switched-on, counts periodic counting pulses which are derived from a clock signal CLK to determine an end of the waiting time corresponding to a desired number of the counting pulses; and
    a waiting-time adjustment apparatus, which is accessible via external connections of the memory circuit, configured to set the desired number of counting pulses.

2. The device of claim 1, wherein the waiting-time adjustment apparatus is configured to receive a set of binary numbers representing the desired number of counting pulses.

3. The device of claim 1, wherein the waiting-time adjustment apparatus is configured to receive a set of binary numbers for selecting the desired number of counting pulses from a plurality of designated desired numbers.

4. The device of claim 3, wherein the waiting-time adjustment apparatus is further configured to select a mode of operation based on the received set of binary numbers.

5. A memory circuit, comprising:
    a timer which is switched-on when a specific operation is initiated and allows a subsequent operation to be started after a defined time period has elapsed, wherein the timer comprises:
        a digital counter which, after it is switched-on, counts periodic counting pulses which are derived from a clock signal; and
        a comparator configured to determine an end of a waiting time when the digital counter has counted a desired number of the counting pulses; and
    a mode register, which is accessible via external connections, having a plurality of register cells for storage of adjustment information, wherein a set of m cells of the mode register is selected for storage of an m-bit word which contains a waiting time setting information for setting the desired number of counting pulses.

6. The memory circuit of claim 5, wherein m bits are required for representation of the waiting time setting information, wherein each waiting time setting information in the m-bit word is represented by an associated m-bit pattern within a selected subset of the $2^m$ possible bit patterns.

7. The memory circuit of claim 5, further comprising a decoding device configured to receive the m-bit word, which decodes the waiting time setting information for setting the desired number of counting pulses when the m-bit word contains a bit pattern of the selected subset and which selects an alternative operating mode in response to m-bit patterns which do not belong to the selected subset.

8. The memory circuit of claim 7, further comprising:
    a plurality of memory cells which can be selected as a function of address information for connecting to an associated sense line respectively in response to an activation signal, wherein the electrical potential on the associated sense line is changed line from an initially selected precharge potential to a value which is representative of a stored data item and applied to a read amplifier, wherein the timer can be switched on by a start of the activation signal, and wherein a necessary condition for switching the sense lines back to the precharge potential is not produced until the timer has counted the desired number of counting pulses.

9. The memory circuit of claim 5, wherein the timer initiates a switch back of the associated sense line to the precharge potential as soon as the timer has counted the desired number of counting pulses.

10. The memory circuit of claim 5, wherein the memory circuit is a random access memory (RAM) module.

11. The memory circuit of claim 5, wherein the memory circuit is a dynamic random access memory (DRAM) module and wherein the waiting time setting information is a $t_{RAS}$ waiting time in the DRAM module.

12. A memory circuit, comprising:
    a memory cell block;
    a control device configured to control read accesses from and write accesses to the memory cell block;
    an instruction decoder connected a first set of inputs for receiving instruction bits and providing an instruction to the control device;
    a timer configured to control a waiting time between sequential memory access operations, the timer comprising:

a digital counter configured to count a number of periodic pulses derived from a clock signal; and a comparator configured to determine an end of the waiting time when the digital counter has counted a desired number of the periodic pulses and to provide a signal to the control device when the end of the waiting time has been determined; and a mode register connected to a second set of inputs for receiving address bits of a memory cell to be accessed in a first mode and for receiving waiting time adjustment information in a second mode, the mode register having a plurality of register cells for storage of adjustment information, wherein a subset of the plurality of the register cells of the mode register is selected for storage of an m-bit word which contains the waiting time adjustment information for setting the desired number of periodic pulses.

13. The memory circuit of claim 12, wherein the instruction decoder is further configured to provide a signal for selecting a mode of operation of the mode register.

14. The memory circuit of claim 12, wherein the m-bit word is a binary number representing the desired number of periodic pulses.

15. The memory circuit of claim 12, further comprising a decoder for receiving the m-bit word as a binary number which is utilized to select one of a plurality of designated desired numbers of period pulses, wherein the selected designated desired number is forwarded to the comparator.

16. The memory circuit of claim 15, wherein the plurality of designated desired numbers comprises a set non-linear graduated numbers.

17. The memory circuit of claim 15, wherein the decoder is further configured to output a signal to the control device for selecting an alternative mode of operation based on the received binary number.

18. The memory circuit of claim 12, wherein the decoder is further configured to output an inhibitor signal to the comparator based on the received binary number.

19. The memory circuit of claim 12, wherein the instruction decoder provides an activation signal for activating the timer.

20. The memory circuit of claim 12, wherein the memory circuit is a dynamic random access memory (DRAM) module and wherein the waiting time adjustment information is a $t_{RAS}$ waiting time in the DRAM module.

* * * * *

UNITED STATES PATENT AND TRADEMARK OFFICE
CERTIFICATE OF CORRECTION

PATENT NO. : 7,355,921 B2
APPLICATION NO. : 11/386043
DATED : April 8, 2008
INVENTOR(S) : Andre Schaefer et al.

It is certified that error appears in the above-identified patent and that said Letters Patent is hereby corrected as shown below:

Column 6, Line 25, please delete "20" and insert -- $2^0$ --;

Column 6, Line 25, please delete "24" and insert -- $2^4$ --.

Signed and Sealed this

Sixteenth Day of September, 2008

JON W. DUDAS
*Director of the United States Patent and Trademark Office*